United States Patent
Su et al.

(10) Patent No.: US 7,194,097 B2
(45) Date of Patent: Mar. 20, 2007

(54) AUDIO CONTROL DEVICE

(75) Inventors: Chu-Ting Su, Hsinchu (TW); Yi-Shu Chang, TaiNan (TW); Jul-Cheng Huang, Hsinchu (TW); Wen-Chi Wang, YunLi Hsien (TW)

(73) Assignee: Realtek Semiconductor Corp., Hsinchu (TW)

( * ) Notice: Subject to any disclaimer, the term of this patent is extended or adjusted under 35 U.S.C. 154(b) by 838 days.

(21) Appl. No.: 10/441,045

(22) Filed: May 20, 2003

(65) Prior Publication Data

US 2003/0219134 A1 Nov. 27, 2003

(30) Foreign Application Priority Data

May 21, 2002 (TW) .................................. 91110583

(51) Int. Cl.
*H03F 21/00* (2006.01)
(52) U.S. Cl. ........................ 381/120; 713/324
(58) Field of Classification Search ................ 381/120; 713/300, 323, 324, 340
See application file for complete search history.

(56) References Cited

U.S. PATENT DOCUMENTS

| | | | |
|---|---|---|---|
| 6,552,445 B1 * | 4/2003 | Yang | 307/38 |
| 6,941,114 B1 * | 9/2005 | Kuo et al. | 455/74 |
| 7,055,049 B2 * | 5/2006 | Atkinson | 713/324 |

* cited by examiner

*Primary Examiner*—Brian Pendleton
(74) *Attorney, Agent, or Firm*—Troxell Law Office PLLC (57) ABSTRACT

An Audio Codec which comprises a power selecting circuit an audio compiler circuit and a control amplifier circuit. The power selecting circuit receives at least a primary power source and an auxiliary power source and outputs a working power selected from the power sources. The auxiliary power source is selected and output to the control amplifier circuit only when the computer is at a power-off status. When the computer is power-on, the primary power source will be selected and output to both the audio compiler circuit and the control amplifier circuit. Therefore, the Audio Codec of the present invention only needs one set of internally furnished control amplifier circuit to both operate on the normal power-on status and perform the Power OFF CD function.

20 Claims, 6 Drawing Sheets

AUDIO CONTROL DEVICE

FIELD OF THE INVENTION

The invention relates to an audio control circuit in particular to an Audio Codec chip with a power selecting circuit that can accept both a computer primary power supply and a computer auxiliary power supply so as to attain the Power Off CD function, that is, to play music from a CD-ROM device when the computer system is power-off.

BACKGROUND OF THE INVENTION

The needs for the functions provided by personal computers (also referred as PC hereinafter) are vastly increased, and so as the hardware of the computers. During the recent years, Multimedia features and applications thereof have become an important issue, and an audio system with high performance and high quality also becomes a necessity of the computer.

During an ordinary operation mode of the computer, the data processed by the computer is Digital, however the voice we heard is Analog. Therefore, in the audio system of the computer, it needs to convert Digital signals to Analog signals, and also needs to convert Analog signals to Digital signals. The device that manages such a work in the audio system is so-called "Audio Codec". Therefore, INTEL Corp. has defined a set of standards for audio systems, namely the "Audio Codec'97". This design not only can prevent the analog signals from being interfered by the digital signals, but also can improve the Signal-to-Noise Ratio (SNR) (p.s. the SNR of PC in market can now reach 90 db). As a result, "Audio Codec" has become a mainstream in the audio system of the personal computers.

On the other hand, there has been established with a set of standards of PC Power Management in the operating system of PC. The PC Power Management has a special feature to allow the computer to be "Wake-Up" by its auxiliary power source even when the computer is at a power-off status. It is found that, the auxiliary power source not only can be used to provide the "Wake-Up" function of PC, but also can be applied on various multimedia applications. Hence, some computer manufacturers developed a function, so-called "Power Off CD", which can play music CD by using the aforesaid auxiliary power source of the PC Power Management system even when the computer is "power-off". That is, to provide an auxiliary power source to the CD-ROM device so as to allow the users to play music CD with the CD-ROM device without the need to power-on the computer.

However, since the conventional standards of the "Audio Codec'97" are merely for audio applications only, therefore, we will need to apply additional power amplifiers and switches (which are furnished outside the "Audio Codec'97") to connect with both of the CD-ROM device and the auxiliary power source so as to perform the "Power Off CD" function.

Figure 1:
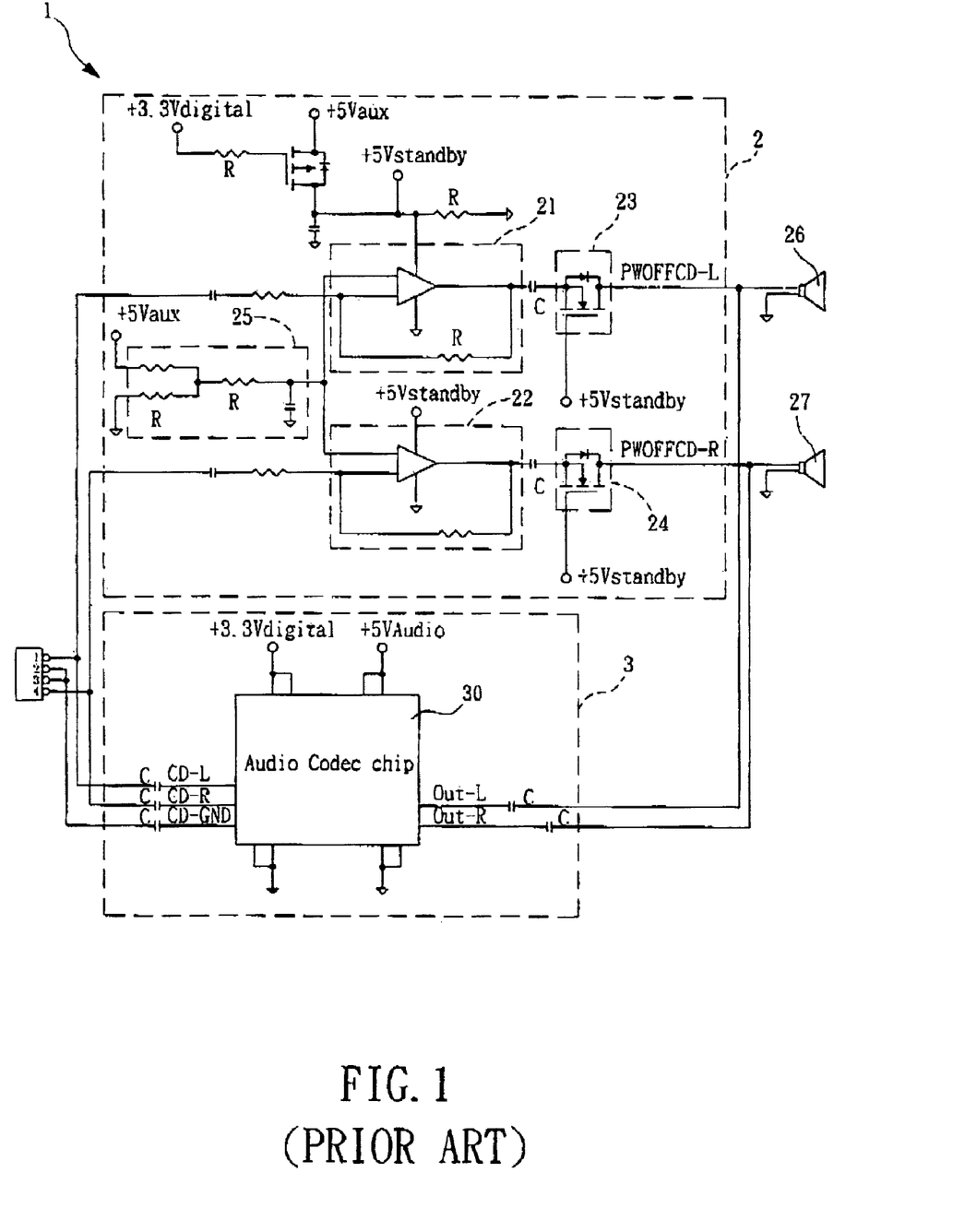
FIG. 1 is a schematic diagram showing an audio control circuit of prior art.

Please refer to FIG. 1, it is an audio device of prior art which uses external power amplifies and external switches to co-operate with the Audio Codec chip for attaining the function of "Power Off CD" (i.e., to play CD music when the primary power source of PC is "power-off"). As shown in FIG. 1, the audio device 1 includes an Audio Codec 3 and an audio control circuit 2. The Audio Codec 3 is a single IC chip 30 (also referred as Audio Codec chip 30 hereinafter) which is preferably an "Audio Codec'97" chip The audio control circuit 2 comprises two switch circuits 23, 24, a voltage divider circuit 25, and two amplifier circuits 21, 22. The two amplifier circuits include the first amplifier circuit 21 and the second amplifier circuit 22. Audio signals coming from the Left Channel (CD_L) of the CD-ROM device are amplified by the first amplifier circuit 21. And then, the amplified audio signals are transmitted through the first switch circuit 23 (PWOFFCD_L) which controls whether the signals will be output to (or played by) the left speaker 26 or not. Similarly, audio signals coming from the Right Channel (CD_R) of a CD-ROM device are amplified by the second amplifier circuit 22. These amplified audio signals are then transmitted through the second switch circuit 24 (PWOFFCD_R) which controls whether these signals will be output to (or played by) the right speaker 27 or not The Left Channel (CD_L), Right Channel (CD_R) and Ground (CD_GND) of the CD-ROM device are also connected to corresponding input pins of the Audio Codec chip 30. Output pins, including Out_L and Out_R, of the Audio Codec chip 30 are also connected to corresponding speakers 26, 27 respectively.

In addition, there are several power supply pins such as 3.3 Vdigital, 5 Vaux, and 5 VAudio. Wherein, 5 VAudio is for driving the Audio Codec chip 30 and the amplifier circuits 21, 22. 3.3 Vdigital is used as a control signal for digital control logic of the Audio Codec chip 30. Both 5 VAudio and 3.3 Vdigital are primary power sources of the and are available only when the PC is power-on. 5 Vaux is the auxiliary power source and are available even when the PC is power-off. It can be seen from FIG. 1 that, in a prior art audio device 1, the Audio Codec chip 30 can only accept the primary power sources 5 VAudio and 3.3 Vdigital. Therefore, the Audio Codec chip 30 can only work in a PC power-on status. In order to achieve the goal of "Power Off CD", the prior art audio device 1 needs to apply additional and external amplifier circuits 21, 22 which are driven by the auxiliary power source 5 Vaux. When the PC is power-off, the auxiliary power source 5 Vaux is still available such that the audio signals coming from the CD-ROM device can be amplified by ink amplifier circuits 21, 22 and then output to the speakers 26, 27. It is noted that, the audio control circuit 2 provides no power selecting function at all. Which means, the Audio Codec chip 30 can only accept the primary power sources 5 VAudio and 3.3 Vdigital, while the external amplifier circuits 21, 22 can only accept the auxiliary power source 5 Vaux. The 3.3 Vdigital and 5 Vstandby used in the audio control circuit 2 are merely control signals for controlling the switches 23, 24 only but not to provide "power selecting" function.

However, it is understood that the Audio Codec chip 30 itself is also furnished (built-in) with internal amplifier circuits (not shown in the figures). These internal amplifier circuits provide not function when the PC is power-off since no power is supplied thereto. It is obvious that, the installment of the extol amplifier circuits 21, 22 addition to the internal ones is a waste of money, but also a waste of space on the circuit board. Moreover, the prior art audio control circuit 2 shown in FIG. 1 can only provides the function of Power OFF CD but cannot prevent Noise which is generated when operating the CD-ROM device.

SUMMARY OF THE INVENTION

To solve the foregoing problems of the prior art, the primary object of the present invention is to provide an audio control device which uses only one set of amplifier circuits to operate in both PC power-on and PC power-off statuses.

As a result, the number of components, cost and space needed for the circuits are reduced.

Another object of the present invention is to provide an audio control device which comprises a power selecting circuit for outputting a power selected from a primary power source and an auxiliary power source. The selected power is then output to the internal amplifier circuits which are built-in the Audio Code chip. Therefore, no matter the PC is power-on or power-off, the internal amplifier circuits of Audio Code chip can always be driven by the selected power output from the power selecting circuit.

A further object of the present invention is to provide an audio control device, wherein the aforesaid power selecting circuit is built-in (integrated-in) the Audio Code chip to be a single IC chip.

Yet another object of the present invention is to provide an audio control device in which a ground signal of the CD-ROM device is connected to an input pin of the amplifier circuit for reducing the Noise generated by the CD-ROM device so as to obtain a better effect of audio output.

In order to achieve the aforesaid objects, a preferred embodiment of the audio control device in accordance with the present invention comprises:

an audio compiler circuit for performing analog/digital signal transformations of audio signals;

a control amplifier circuit for accepting an input audio signal and outputting an amplified output signal; and a power selecting circuit connecting to both the audio compiler circuit and the control amplifier circuit, said power selecting circuit receiving at least a first power source and a second power source and outputting one of the power sources according to a selecting signal;

wherein the audio compiler circuit and the control amplifier circuit are integrated into a single IC chip (namely the Audio Codec chip);

wherein said power selecting circuit outputs the second power source to said audio compiler circuit when there is only the second power source being supplied thereto;

wherein said power selecting circuit outputs the first power source to both the audio compiler circuit and the control amplifier circuit when there is the first power source being supplied thereto.

Preferably, the control amplifier circuit comprises a first amplifier circuit, a second amplifier circuit, a third amplifier circuit, and a fourth amplifier circuit. The first amplifier circuit is connected to the second amplifier circuit in serial so as to process a first channel of the input audio signal. The third amplifier circuit is connected to the fourth amplifier circuit in serial so as to process a second channel of the input audio signal. Wherein, the first and the third amplifier circuits each has an input end thereof connecting to a ground signal port "CD_GND" of a CD-ROM device.

Preferably, the power selecting circuit, the audio compiler circuit and the control amplifier circuit are all integrated into a single IC chip.

Yet another object of the present invention is to provide an audio amplifier device of an electronic device. The electronic device is capable of providing a first power source and a second power source. The audio amplifier device is operatable by using said second power source when the first power source is absent. The audio device comprises:

a first amplifier for receiving an input audio signal and outputting a first amplified signal;

a volume control circuit for receiving said first amplified signal and outputting a controlled volume signal;

a switch circuit connecting to both the first amplifier and the volume control circuit for receiving signals therefrom, the switch circuit outputting a selected signal selected from the first amplified signal and the controlled volume signal according to a control signal; and a second amplifier for receiving said selected signal and outputting an output audio signal;

wherein said control signal is according to the absence of the first power source.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention discloses an audio control device with specially designed power selecting circuit, which can be exemplified by the preferred embodiments as described hereinafter.

Figure 2:
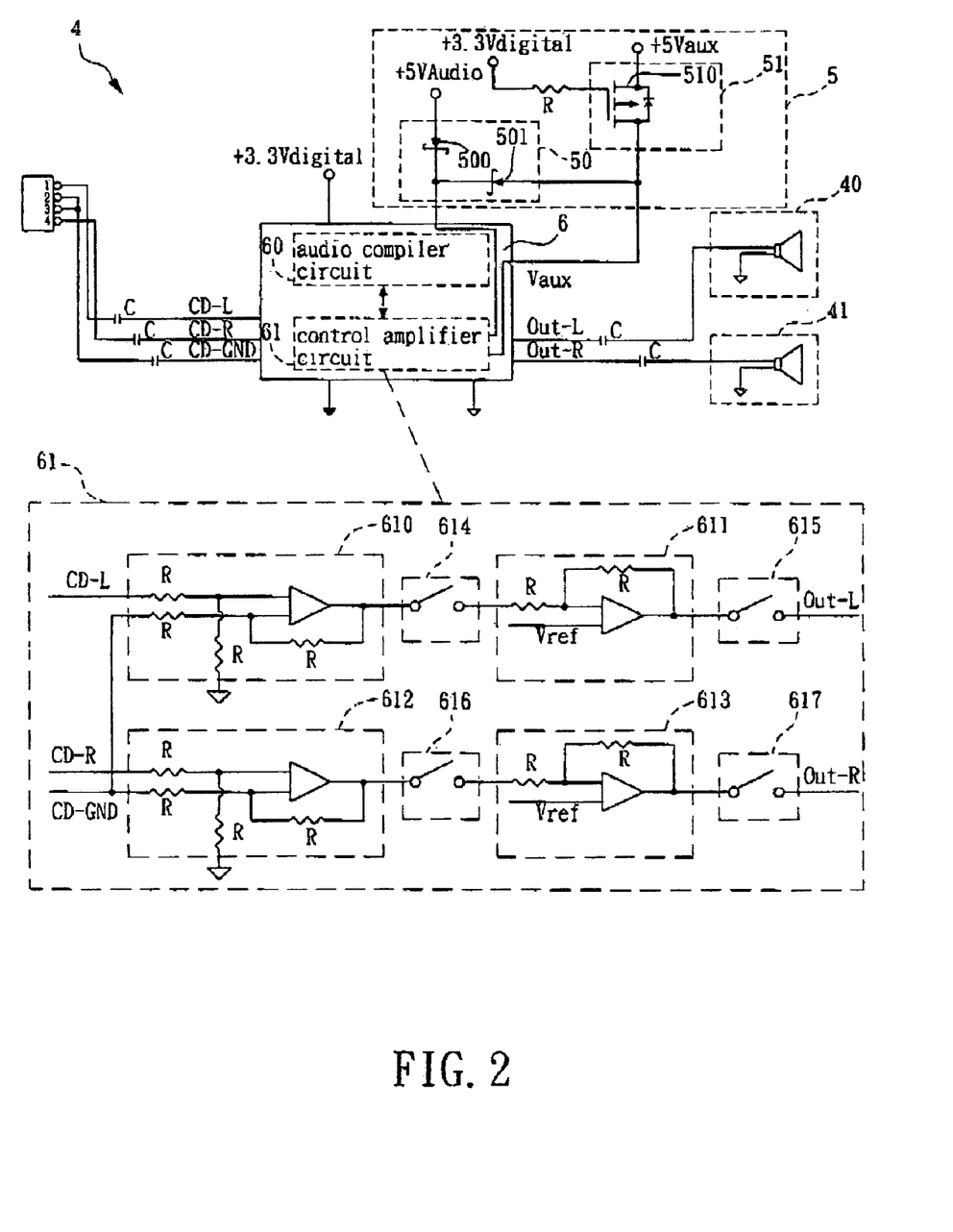
FIG. 2 is a schematic diagram illustrating the first embodiment of the audio control device in accordance with the present invention.

Please refer to FIG. 2, which is a schematic diagram showing the first embodiment of the audio control device 4 in accordance with the present invention. The primary concept of this embodiment is to apply a power selecting circuit 5 which can output a working power selected from the primary power source 5 VAudio and the auxiliary power source 5 Vaux to the Audio Codec 6 for driving the same internal control amplifier circuit 61. Therefore, the audio control device 4 of the present invention only needs one set of internal control amplifier circuit 61 (which is built-in the Audio Codec 6) to both operate on normal power-on status and perform the Power OFF CD function.

The audio control device 4, as which shown in FIG. 2, comprises a power selecting circuit 5 and an audio compiler/control circuit 6 (also referred as Audio Codec hereinafter). The power selecting circuit 5 receives the primary power source 5 VAudio (also referred as the first power source hereinafter), a pry control signal 3.3 Vdigital and an auxiliary power source 5 Vaux (also referred as the second power source hereinafter). In this embodiment, the power selecting circuit 5 comprises a separation circuit 50 and a switch circuit 51. The separation circuit 50 comprises at least two Schottky diodes 501, 502 connected to each other in parallel. The anode of the Schottky diode 500 is connected to the primary power source 5 VAudio, while the anode of the other Schottky diode 502 is connected to an output end of the switch circuit 51. The joint output end (cathode) of these two Schottky diodes 501, 502 is then further connected to the Audio Codec 6. By employing these Schottky diodes 501, 502, the separation circuit 50 separates the primary power source 5 VAudio from the auxiliary power source 5 Vaux. The switch circuit 51 comprises at least one metal-oxide-semiconductor field effect transistor 510 (MOSFET) having an input end thereof connected to the auxiliary power source 5 Vaux and a gate end thereof connected to the primary control signal 3.3 Vdigital. The primary control signal 3.3 Vdigital acts as a selecting signal of the switch circuit 51 in a manner that, when the primary control signal 3.3 Vdigital is at a high level status (i.e., when the PC is power-on), the switch circuit 51 will be switched OFF such that the 5 Vaux will not be output by the switch circuit 51. On the other hand, when the 3.3 Vdigital is at a low level status (i.e., when the PC is power-off), the switch circuit 51 will be switched ON so as to output the 5 Vaux to the Audio Codec 6. That is, the switch circuit 51 can control the output of the 5 Vaux in such a manner that the auxiliary power source 5 Vaux is output only if the PC is at the power-off status. On the other hand, when the PC is power-on, the primary power source 5 VAudio can be provided to the Audio Codec 6 through the separation circuit 50 such that the Audio Codec 6 can operate under normal PC power-on condition.

It is notable that, although the switch circuit 51 illustrated in FIG. 2 uses the primary control signal 3.3 Vdigital as the selecting signal to decide whether or not to output the auxiliary power source 5 Vaux. However, any person who is skilled in the art will be very easy to modify the switch circuit so as to use the primary power source 5 VAudio to act as the selecting signal of the switch circuit.

The Audio Codec 6 (audio compiler/control circuit) is a single IC chip and generally comprises an audio compiler circuit 60 and a control amplifier circuit 61 built therein. The Audio Codec 6 is connected to the ports of CD_L, CD_R and CD_GND of a CD-ROM device for receiving audio signals therefrom. Theses audio signals are processed and amplified by the audio compiler circuit 60 and a control amplifier circuit 61 and then output to the speakers 40, 41 via the ports of Out_L and Out_R. The Audio Codec 6 further connects to the 3.3 Vdigital for control signal of digital control logic thereof. In this preferred embodiment, there are two outputs from the power selecting circuit 5, wherein one of the output is from the switch circuit 51 and is connected only to the control amplifier circuit 61 of the Audio Codec 6, while the other output is from the primary power source 5 Vaudio and is connected to both the audio compiler circuit 60 and the control amplifier circuit 61. However, in another embodiment, the output of the power selecting circuit 5 can also be a joint single output which is directly connected to the control amplifier circuit 61.

The audio compiler circuit 60 of the Audio Codec 6 is driven by both the primary power source 5 VAudio and the primary control signal 3.3 Vdigital and is active only when the PC is power-on. The audio compiler circuit 60 is for performing the analog/digital signal transformations. That is, the audio signals can be converted into digital signals by the audio compiler circuit 60 for further operation handled by PC, for example, to be converted into a digital file, to be processed by software, or be saved in a Hard Disk of PC. On the other hand, digital signals accessed from the PC or coming from the IDE cable (not shown in figures) of the CD-ROM can be converted into audio signals by the audio compiler circuit 60 and then output through the speakers 40, 41. Since this audio compiler circuit 60 is the same with the conventional technique and forms little part of the present invention, therefore no more description will be provided. The control amplifier circuit 61 accepts the input audio signals from the ports of CD_L, CD_R and CD_GND of the CD_ROM device and outputs amplified output signals to the speakers 40, 41 through the output ports of Out_L and Out_R. Because the control amplifier circuit 61 of the Audio Codec 6 is connected to the power selecting circuit 5, therefore it can operate even when the PC is power-off, that is, to provide so-called "Power OFF CD" function.

As shown in the enlarged circuit block of FIG. 2, a preferred embodiment of the control amplifier circuit 61 comprises a first amplifier circuit 610, a second amplifier circuit 611, a third amplifier circuit 612, a fourth amplifier circuit 613, a first channel switch 614, a second channel switch 616, a first mute switch 615, and a second mute switch 617. The first amplifier circuit 610 is connected to the second amplifier circuit 611 in serial so as to process a first channel (e.g. the left channel CD_L) of the audio signal. And, the third amplifier circuit 612 is connected to the fourth amplifier circuit 613 in serial so as to process a second channel (e.g. the right channel CD_R) of the audio signal. The first and the third amplifier circuits 610, 612 each has an input end thereof connecting to the ground signal port "CD_GND" of the CD-ROM device for receiving the ground signal as a reference to eliminate the Noise generated by the CD-ROM device. As a result, a better effect of audio output can be obtained. In this embodiment, the mute switches 615, 617 are normally "ON" when the PC is power-off. However, when the PC is power-on, the mute switches 615, 617 are controllable by the computer software. Such that the PC will be able to control whether or not to output audio signals through the control amplifier circuit 61 by using computer software when the PC is power-on.

Figure 3:
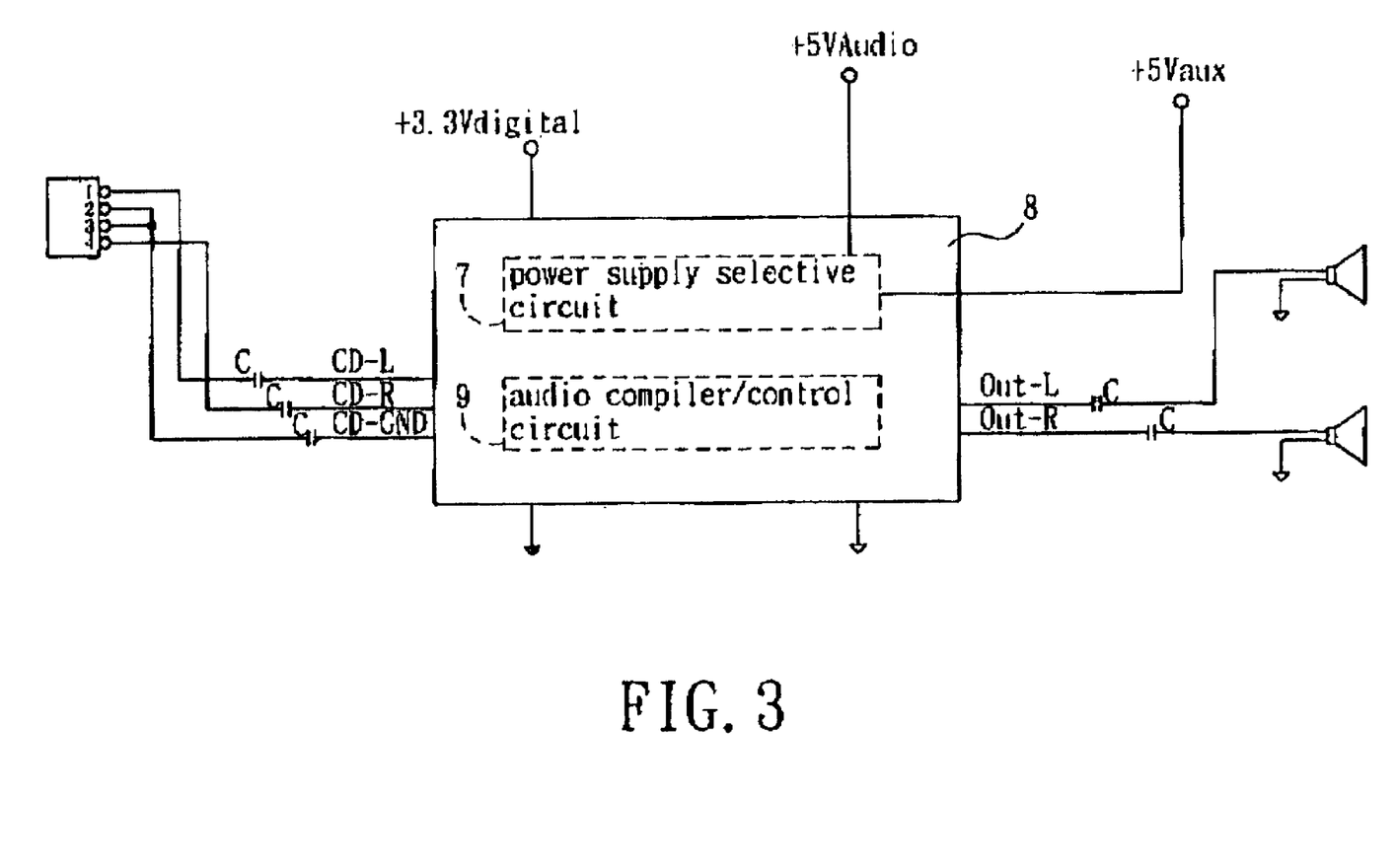
FIG. 3 is a schematic diagram illustrating the second embodiment of the audio control device in accordance with the present invention.

Please refer to FIG. 3, which is a schematic diagram illustrating the second preferred embodiment of the audio control device 8 in accordance with the present invention. In this preferred embodiment, most elements are similar to which previously illustrated in FIG. 2, thus only schematic block diagram is provided herewith. The most significant difference between the audio control device 8 shown in FIG. 3 and the other audio control device 4 illustrated in FIG. 2 is that the power selecting circuit 7 and the audio compiler/control circuit 9 are now integrated into a single IC chip (e.g. the Audio Codec chip). Since the audio control device 8 and the power selecting circuit 7 could be the same as which disclosed in FIG. 2, therefore no detailed description to these two elements are provided here.

Figure 4:
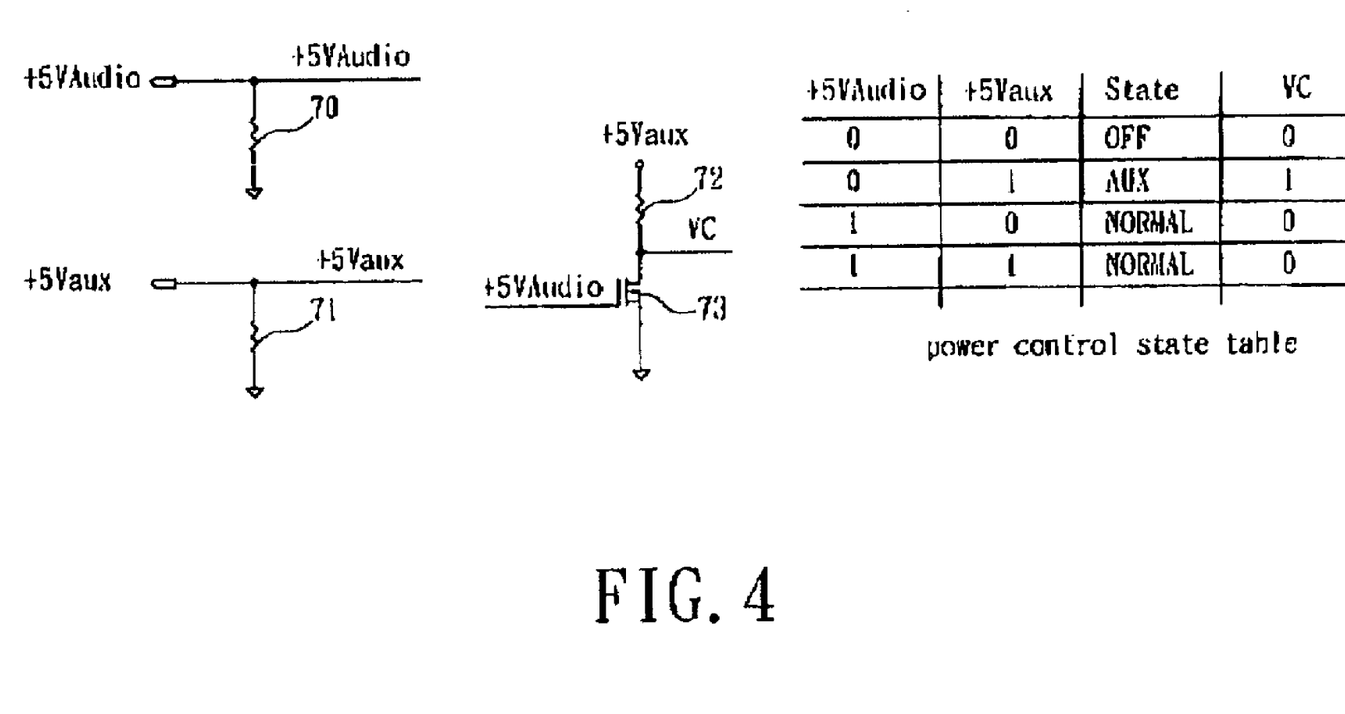
FIG. 4 is a schematic diagram showing a status table of power selection performed by the power selecting circuit 7 of FIG. 3.

Please refer to FIG. 4, which is a schematic diagram showing a status table of power selection performed by the power selecting circuit 7 of FIG. 3. As shown in FIG. 4, the primary power source 5 VAudio is connected in parallel with the ground through a resistance 70 before being output as a power source, and auxiliary power source 5 Vaux is also connected in parallel with the ground through another resistance 71 before being output as a power source. The primary power source 5 VAudio connects to the gate of the MOS transistor 73, and the auxiliary power source 5 Vaux connects to the drain (input end) of the MOS transistor 73 through a resistance 72. The source (output end) of the MOS transistor 73 is connected to the ground. A VC signal (voltage control signal) is extracted from the drain of the MOS transistor 73. The state of VC can be used to detect whether the auxiliary power supply is available or not. The status of VC of the MOS transistor 73 can be presented by the status table shown in FIG. 4.

As shown in the status table shown in FIG. 4, when the 5 Vaux and the 5 VAudio are both at logic low (0), it shows that no power is supplied by the primary power supply and auxiliary power supply, so the state of the power supply is OFF and the VC is at logic low (0). When the 5 VAudio is at logic low (0) but the 5 Vaux is at logic high (1), it shows that the auxiliary power source 5 Vaux is available but the primary power source 5 VAudio is off, and therefore the VC is at logic high (1). When the 5 VAudio is at logic high (1), it shows that the state of the primary power supply is in a NORMAL operation state (PC power ON), that is, the CD-ROM is using the primary power source 5 VAudio of the computer and thus the VC signal is at logic low (0).

Figure 5:
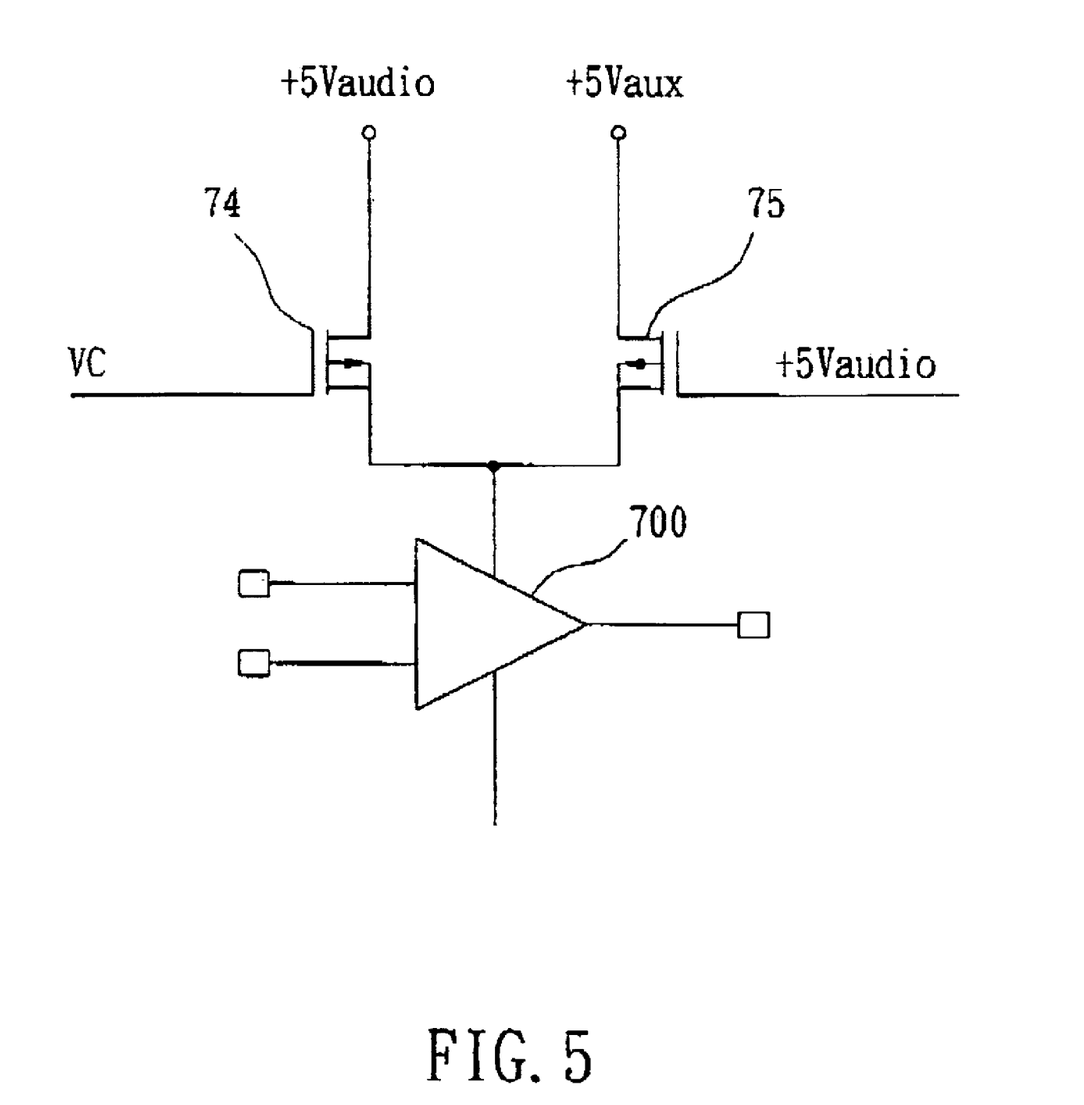
FIG. 5 is a schematic diagram showing the power selecting circuit being applied to an amplifier of the internal amplifier circuit of the present invention so as to obtain the same status table as which illustrated in FIG. 4.

FIG. 5 is a schematic diagram showing the power selecting circuit being applied to an amplifier of the internal amplifier circuit of the present invention so as to obtain the same status table as which illustrated in FIG. 4. The amplifier 700 shown in FIG. 5 can be applied to some of the amplifier circuits 610~613 of the control amplifier circuit 61 illustrated in FIG. 2 to achieve the same status table as which illustrated in FIG. 4. The MOSFETs 74, 75 are connected to the power input end of the amplifier 700 so as to control which one of the power sources (either 5 VAudio or 5 Vaux) is to be supplied to the amplifier 700. This is achieved by using the VC and the 5 VAudio as the control signal to control the gates of the MOSFET 74 and the MOSFET 75 respectively.

Figure 6:
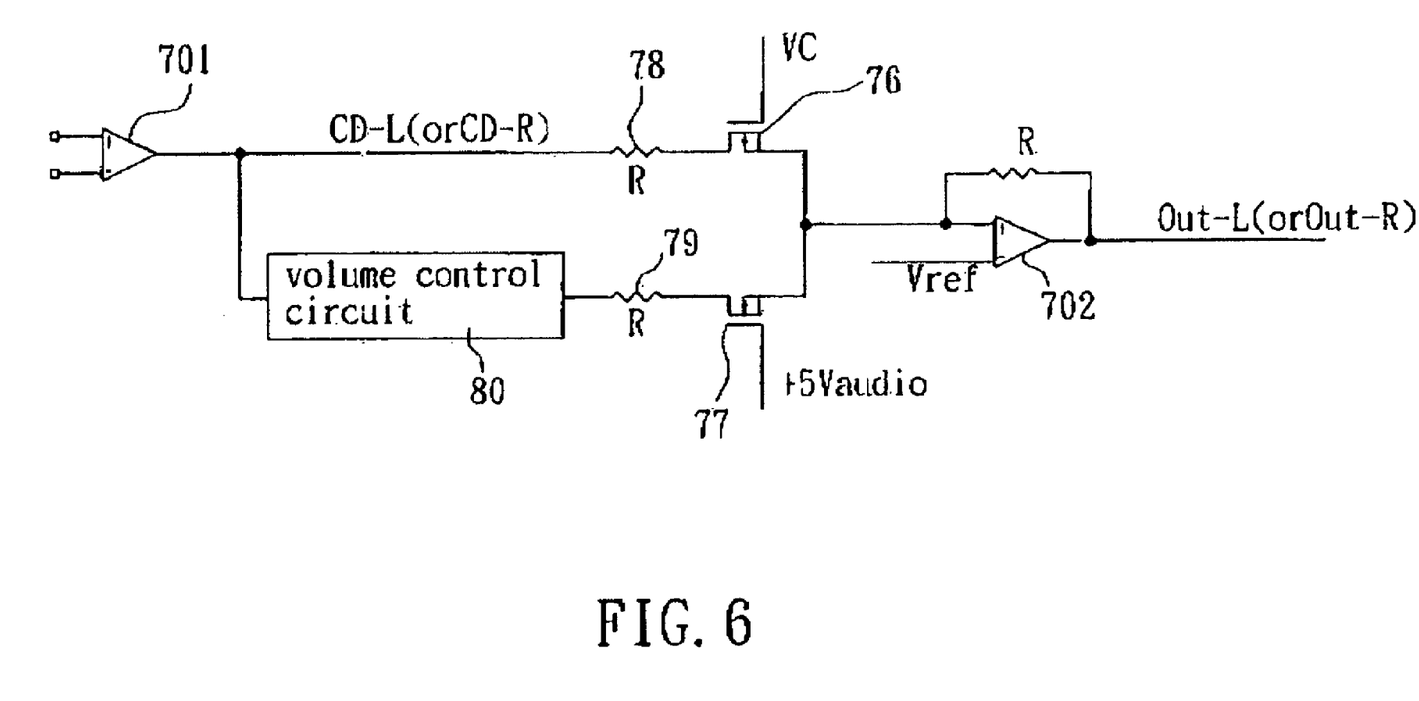
FIG. 6 is a schematic diagram showing a more detail of the internal amplifier circuit in accordance with the present invention.

FIG. 6 is a schematic diagram showing a more detail of the internal amplifier circuit in accordance with the present invention. The internal amplifier circuit comprises a volume control circuit 80 shown in FIG 6. It is noted that, the internal amplifier circuit of FIG. 6 can also be considered as a detailed enlarged view of some part of the control amplifier circuit 61 shown in FIG. 2. In which, the amplifier 701 can be accordance with the first amplifier circuit 610 (or the third amplifier circuit 612), the amplifier 702 can be accordance with the second amplifier circuit 611 (or the fourth amplifier circuit 614), and the combination of the switches 76, 77 can be accordance with the first channel switch 614 (or the second channel switch 616). As shown in FIG. 6, the output route of the audio signal CD-L (or CD-R) is controlled by the switches 76, 77 and will change depending on which power source (either 5 VAudio or 5 Vaux) is supplied thereto. If the control amplifier circuit 61 is using the auxiliary power source 5 Vaux (also referred as the first control status), the audio signal CD-L (or CD-R) output from the amplifier 701 will go through the resistance 78 and the MOSFET 76 (which is controlled by VC), and then be amplified by the amplifier 702 before being output to the Out_L (or Out_R) speaker. When the control amplifier circuit 61 is driven by the primary power source 5 Vaudio (also referred as the second control status), then the audio signal CD-L (or CD-R) output from the amplifier 701 will go through the volume control circuit 80, the resistance 79 and the MOSFET 77 (which is controlled by 5 VAudio), and then be amplified by the amplifier 702 before being output to the Out_L (or Out_R) speaker. It can be seen that the volume control circuit 80 is only activated when the primary power sources (5 VAudio and 3Vdigital) are available. The volume control circuit 80 can be controlled by computer software such that users will be able to adjust the volume of the sounds by using the computer software. Therefore, no matter the PC is power-on or power-off, the internal amplifier circuits of the Audio Code chip can always be driven by the selected power output from the power selecting circuit. Moreover, because the signal transmitting routes for different power sources (5 VAudio or 5 Vaux) are different and do not interfere each other, the same control amplifier circuit 61 can be used in two power supply conditions. That is, the audio control device 4 (or the audio control device 8) of the present invention will be able to employ only one set of control amplifier circuit 61 to operate in both PC power-on and PC power-off statuses. As a result, the number of components, cost and space needed for the circuits are reduced.

It is notable that, the aforementioned embodiments of the power selecting circuits 5, 7 shown in FIGS. 2, 3 are merely for illustrating some of the examples for achieving the aforesaid objects of the present invention only and should not be used to limit the overall scope of the present invention. Any person who is skilled in the art might perform minor modification to the power selecting circuit to obtain the same result easily. The present invention aims to apply a power selecting circuit as a power management unit to cooperate with the Audio Codec in such a manner that, no matter the PC is power-on or power-off, the internal amplifier circuits of the Audio Code can always be driven by a power output from the power selecting circuit selected from the primary power source 5 VAudio and the auxiliary power source 5 Vaux. Therefore, any modifications made by following the same concept to achieve similar results should be considered to be obvious to the present invention.

While the present invention has been shown and described with reference to a preferred embodiment thereof, and in terms of the illustrative drawings, it should be not considered as limited thereby. Various possible modification, omission, and alterations could be conceived of by one skilled in the art to the form and the content of any particular embodiment, without departing from the scope and the spirit of the present invention.

What is claimed is:

1. An Audio Codec integrated circuit, comprising:
    an audio compiler circuit for performing analog/digital signal transformations;
    a control amplifier circuit for accepting an input audio signal and outputs an amplified output signal; and
    a power selecting circuit connecting to both the audio compiler circuit and the control amplifier circuit, said power selecting circuit being capable of receiving at least a primary power source and an auxiliary power source and outputting one of the power sources according to a selecting signal;
    wherein said power selecting circuit outputs the auxiliary power source to said control amplifier circuit when there is only the auxiliary power source being supplied thereto;
    wherein said power selecting circuit outputs the primary power source to both the audio compiler circuit and the control amplifier circuit when there is the primary power source being supplied thereto.

2. The Audio Codec integrated circuit of claim 1, wherein said selecting signal is according to the absence of the primary power source.

3. The Audio Codec integrated circuit of claim 1, wherein the power selecting circuit includes a separation circuit and a switch circuit; the separation circuit separates the primary power source from the auxiliary power source such that only one of the power sources will be output by the power selecting circuit; and, the switch circuit controls the output of the auxiliary power source according to the selecting signal in such a manner that the power selecting circuit outputs the auxiliary power source only if there is no primary power source being received thereby.

4. The Audio Codec integrated circuit of claim 3, wherein the selecting signal is the primary power source itself; the switch circuit is "off" when the primary power source is at a high voltage status, and "on" when the primary power source is at a low voltage status.

5. The Audio Codec integrated circuit of claim 3, wherein the separation circuit comprises at least two Schottky diodes connected to each other in parallel; one of the Schottky diode is connected to the primary power source, while another one is connected to an output end of the switch circuit; and, the switch circuit comprises at least one metal-oxide-semiconductor field effect transistor (MOSFET) having an input end thereof connected to the auxiliary power source and a gate end thereof connected to the selecting signal.

6. The Audio Codec integrated circuit of claim 1, wherein the input audio signal is coming from a CD_L port a CD_R port and CD_GND port of a CD-ROM device.

7. The Audio Codec integrated circuit of claim 1, wherein the control amplifier circuit comprises a first amplifier circuit, a second amplifier circuit, a third amplifier circuit, and a fourth amplifier circuit; the first amplifier circuit is connected to the second amplifier circuit in serial so as to process a first channel of the input audio signal; and, the third amplifier circuit is connected to the fourth amplifier circuit in serial so as to process a second channel of the input audio signal.

8. The Audio Codec integrated circuit of claim 7, wherein the first and the third amplifier circuits each has an input end thereof connecting to a ground signal port "CD_GND" of a CD-ROM device.

9. The Audio Codec integrated circuit of claim 1, wherein the power selecting circuit further receiving a digital power source, and said selecting signal is according to the digital power source.

10. An audio control device, comprising:
a power selecting circuit for receiving at least a first power source and a second power source and outputting a working power selected from said first and second power sources; and
an audio compiler/control circuit connecting to said power selecting circuit for accepting the working power, the audio compiler/control circuit having an audio compiler circuit and a control amplifier circuit built therein;
wherein the audio compiler circuit performs analog/digital signal transformations only if the working power is the first power source;
wherein said control amplifier circuit accepts an input audio signal and outputs an amplified output signal no matter what the working power is the first power source or the second power source.

11. The audio control device of claim 10, wherein the power selecting circuit includes a separation circuit and a switch circuit; the separation circuit separates the first power source from the second power source such that only one of the power sources will be output by the power selecting circuit; and, the switch circuit controls the output of the second power source in such a manner that the power selecting circuit outputs the second power source only if there is no first power source being received thereby.

12. The audio control device of claim 11, wherein the separation circuit comprises at least two Schottky diodes connected to each other in parallel; one of the Schottky diode is connected to the first power source, while another one is connected to an output end of the switch circuit; and, the switch circuit comprises at least one metal-oxide-semiconductor field effect transistor (MOSFET) having an input end thereof connected to the second power source and a gate end thereof connected to a selecting signal.

13. The audio control device of claim 10, wherein the input audio signal is coming from a CD_L port, a CD_R port and CD_GND port of a CD-ROM device.

14. The audio control device of claim 10, wherein the control amplifier circuit comprises a first amplifier circuit, a second amplifier circuit, a third amplifier circuit, and a fourth amplifier circuit; the first amplifier circuit is connected to the second amplifier circuit in serial so as to process a first channel of the audio signal; and, the third amplifier circuit is connected to the fourth amplifier circuit in serial so as to process a second channel of the audio signal; wherein the first and the third amplifier circuits each has an input end thereof connecting to a ground signal port "CD_GND" of a CD-ROM device.

15. The audio control device of claim 10, wherein the audio compiler/control circuit and the power selecting circuit are built in a single IC chip.

16. An audio amplifier device of an electronic device, said electronic device being capable of providing a first power source and a second power source, said audio amplifier device being operatable by using said second power source when the first power source is absent, said audio device comprising:
a first amplifier for receiving an input audio signal and outputting a first amplified signal;
a volume control circuit for receiving said first amplified signal and outputting a controlled volume signal;
a switch circuit connecting to both the first amplifier and the volume control circuit for receiving signals therefrom, said switch circuit outputting a selected signal selected from the first amplified signal and the controlled volume signal according to a control signal; and
a second amplifier for receiving said selected signal and outputting an output audio signal;
wherein said control signal is according to the absence of the first power source.

17. The audio amplifier device of claim 16, wherein the control signal comprises a first control status and a second control status; and
wherein the switch circuit further comprises:
a first channel switch connecting to the first amplifier for receiving the first amplified signal, said first channel switch outputting said first amplified signal as the selected signal when the control signal is at the first control status; and
a second channel switch connecting to the volume control circuit for receiving the controlled volume signal, said first channel switch outputting said controlled volume signal as the selected signal when the control signal is at the second control status.

18. The audio amplifier device of claim 17 further comprising a power selecting circuit for generating said control signal, wherein said power selecting circuit comprises:

a MOS transistor having a gate, a source and a drain, said gate being connected to the first power source, said source being connected to a ground, said drain being connected to the second power source; and a node connecting to the drain of the MOS transistor for outputting a VC signal;

wherein, said power selecting circuit outputting said VC signal as the control signal to the first channel switch when the first power source is absent;

wherein, said power selecting circuit outputting said first power source as the control signal to the second channel switch when the first power source is available.

19. The audio amplifier device of claim 16, wherein the electronic device is a computer.

20. The audio amplifier device of claim 16, wherein the audio amplifier device is built-in an Audio Codec chip.

* * * * *